United States Patent
Raimar

(10) Patent No.: US 10,862,443 B2
(45) Date of Patent: Dec. 8, 2020

(54) OFFSET ADDITION CIRCUITS FOR SENSE TRANSISTORS

(71) Applicant: TEXAS INSTRUMENTS INCORPORATED, Dallas, TX (US)

(72) Inventor: Nandakishore Raimar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 303 days.

(21) Appl. No.: 16/105,604

(22) Filed: Aug. 20, 2018

(65) Prior Publication Data

US 2020/0059212 A1    Feb. 20, 2020

(51) Int. Cl.

| | |
|---|---|
| *G01R 19/00* | (2006.01) |
| *G01R 19/15* | (2006.01) |
| *H03F 3/45* | (2006.01) |
| *H03G 3/30* | (2006.01) |
| *G01R 15/00* | (2006.01) |
| *H02P 6/28* | (2016.01) |

(52) U.S. Cl.
CPC ......... *H03F 3/45179* (2013.01); *G01R 15/00* (2013.01); *G01R 19/0092* (2013.01); *H03G 3/30* (2013.01); *H02P 6/28* (2016.02); *H03F 2203/45024* (2013.01)

(58) Field of Classification Search
CPC ............... G01R 19/00; G01R 19/0092; G01R 19/16519; G01R 19/15; G01R 15/00; H03F 3/45; H03F 3/45179
See application file for complete search history.

(56) References Cited

U.S. PATENT DOCUMENTS

2014/0375342 A1* 12/2014 Chuah ............... G01R 19/0092
324/713

* cited by examiner

*Primary Examiner* — Neel D Shah
(74) *Attorney, Agent, or Firm* — John R. Pessetto; Charles A. Brill; Frank D. Cimino

(57) ABSTRACT

In examples, an apparatus for sensing current comprises a power transistor; a sense transistor coupled to the power transistor; and an offset addition circuit coupled to the power transistor and the sense transistor, the offset addition circuit comprising a first pair of transistors and a differential amplifier. The apparatus also comprises a cascode amplifier circuit coupled to the offset addition circuit, the cascode amplifier circuit comprising a second pair of transistors, and a gain trim circuit coupled to the cascode amplifier circuit, the gain trim circuit including another differential amplifier and a third transistor. The apparatus further includes an analog-to-digital converter (ADC) coupled to the gain trim circuit and storage coupled to the ADC.

20 Claims, 3 Drawing Sheets

OFFSET ADDITION CIRCUITS FOR SENSE TRANSISTORS

BACKGROUND

None.

SUMMARY

In examples, an apparatus for sensing current comprises a power transistor; a sense transistor coupled to the power transistor; and an offset addition circuit coupled to the power transistor and the sense transistor, the offset addition circuit comprising a first pair of transistors and a differential amplifier. The apparatus also comprises a cascode amplifier circuit coupled to the offset addition circuit, the cascode amplifier circuit comprising a second pair of transistors, and a gain trim circuit coupled to the cascode amplifier circuit, the gain trim circuit including another differential amplifier and a third transistor. The apparatus further includes an analog-to-digital converter (ADC) coupled to the gain trim circuit and storage coupled to the ADC.

In examples, an apparatus for sensing current comprises a power transistor; a sense transistor coupled to the power transistor; and an offset addition circuit coupled to the power and sense transistors. The offset addition circuit comprises a first transistor configured to couple to the power transistor via a switch; a second transistor coupled to the sense transistor; a resistor coupled to the first transistor; and a differential amplifier having inputs coupled to the resistor and the second transistor and having an output coupled to a cascode amplifier circuit, the cascode amplifier circuit coupled to the sense transistor in a feedback loop configuration.

In examples, an apparatus for sensing current comprises a power transistor; a sense transistor coupled to the power transistor; and an offset addition circuit coupled to each of the power transistor and the sense transistor. The offset addition circuit comprises a first transistor comprising a first drain terminal, a first source terminal, and a first gate terminal; a second transistor comprising a second drain terminal, a second source terminal, and a second gate terminal, wherein the first drain terminal and the second drain terminal are each coupled to a voltage source; a first amplifier comprising a first inverting terminal, a first non-inverting terminal, and a first output terminal; and a resistor coupled to the first source terminal and to each of the first non-inverting terminal of the first amplifier and a bias current source. The apparatus also comprises a first switch coupled to the power transistor, to an inverter, and to the first gate terminal of the first transistor. The apparatus also comprises a second switch coupled to the voltage source, to the inverter, and to the first gate terminal of the first transistor. The apparatus further includes a cascode amplifier circuit comprising a third transistor comprising a third drain terminal, a third source terminal, and a third gate terminal, the cascode amplifier circuit further comprising a fourth transistor including a fourth drain terminal, a fourth source terminal, and a fourth gate terminal, the third gate terminal coupled to the first output terminal of the first amplifier, the third drain terminal coupled to the sense transistor, the third source terminal coupled to the fourth source terminal. The apparatus further includes a gain trim circuit coupled to the fourth drain terminal and comprising a second amplifier comprising a second inverting terminal, a second non-inverting terminal, and a second output terminal; a second resistor coupled to the second non-inverting terminal; a variable resistor coupled in a feedback loop to the second inverting terminal; and a third transistor coupled to each of the second output terminal and to the trim resistor. The apparatus further includes a third amplifier having a third inverting terminal, a third non-inverting terminal, and a third output terminal, the third inverting terminal coupled to the third transistor and to the third output terminal via a third resistor. The apparatus also comprises an analog-to-digital converter (ADC) coupled to the third output terminal; storage coupled to the ADC; and subtraction logic coupled to the storage and to the ADC.

BRIEF DESCRIPTION OF THE DRAWINGS

For a detailed description of various examples, reference will now be made to the accompanying drawings in which.

DETAILED DESCRIPTION

Sensorless brushless direct current (BLDC) motors are driven by high-power transistors, such as, for example, power metal oxide semiconductor field effect transistors (MOSFETs). These power MOSFETs are used to control the drive state of the motor. A BLDC motor is driven by supplying current to several phases of the motor. While driving the BLDC motor, it is often desirable for the phase currents of the motor to be aligned with the back electromotive-force (BEMF) voltage of the motor to achieve improved efficiency since the BLDC operates efficiently when the stator flux and the rotor flux are aligned in quadrature (90°). As the power MOSFET draws significant current, the currents are sensed so that the drive angle may be adjusted to improve efficiency.

Figure 1:
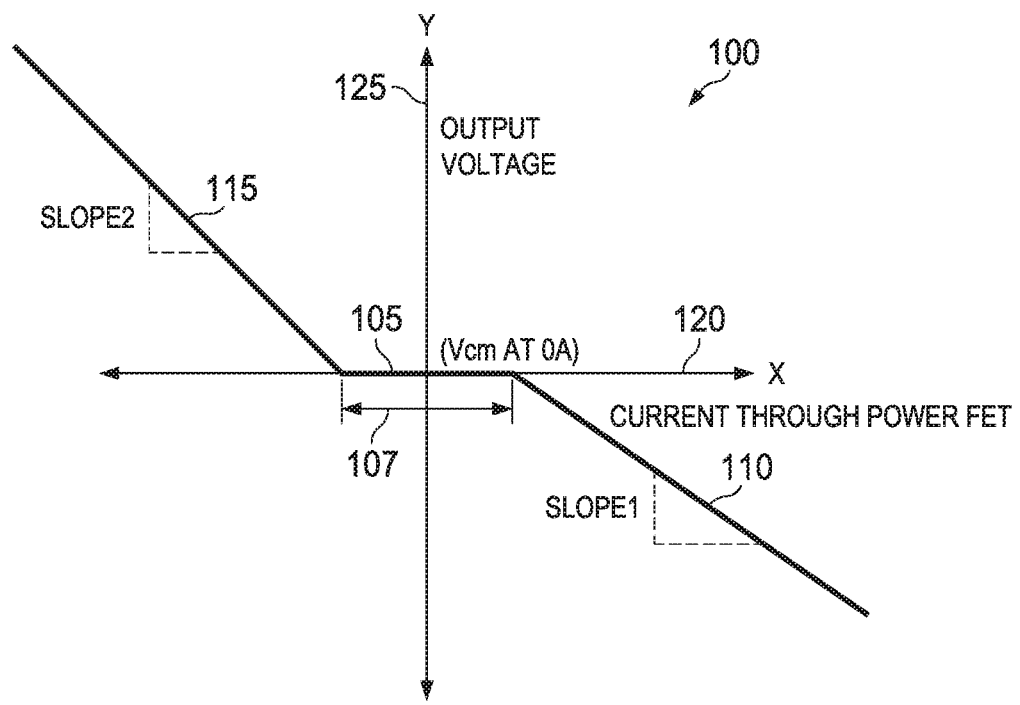
FIG. 1 illustrates a transfer function of input current and sensed output voltage in accordance with prior art.

Conventional methods to sense a current through the motor use two sensing elements. For example, two sense field effect transistors (FETs) are used to sense currents between the motor and a phase during either high-side or low-side sensing. One sense FET senses positive current from the phase to the motor and the other sense FET senses the negative current from the motor to the phase. The sense FETs output voltages that represent the sensed currents. However, conventional methods to sense currents are limited as a dead band may occur during current sensing through the power MOSFET. For example, FIG. 1 shows a graph 100 of a transfer function 105. The transfer function 105 describes the relationship between the current flowing through a power MOSFET (current depicted along the x-axis 120) and sensed output voltage by the aforementioned multiple sense FETs (voltage depicted along the y-axis 125). The top-left quadrant of the graph 100 describes the behavior of the transfer function 105 when one sense FET senses negative current and the bottom-right quadrant of the graph 100 describes the behavior of the transfer function 105 when the other sense FET senses positive current.

As the transfer function 105 illustrates, for certain current values the sense FET output voltages do not change. Deadband 107 depicts this region of current values. Unlike the remainder of the bottom-right quadrant, where voltage values change with current values (as slope 110 depicts), voltage does not vary with current in the portion of the deadband 107 that coincides with the bottom-right quadrant. Similarly, unlike the remainder of the top-left quadrant, where voltage values change with current values (as slope 115 depicts), voltage does not vary with current in the portion of the deadband 107 that coincides with the top-left quadrant. This deadband 107 represents a common mode voltage at an input of the sense FET that causes current saturation in the sense FET when the associated power FET is turned on to supply current to a phase of the BLDC motor. Conventional solutions require trimming the transfer function of each sense FET, which adds cost to the current sense circuit.

Accordingly, disclosed herein is a current sense circuit that uses a single sense field effect transistor (FET) (e.g., a MOSFET) to sense current through a power field effect transistor (FET) (e.g., a MOSFET) by using a predetermined offset voltage to lift the transfer function of the sense FET. The current sense circuit avoids the aforementioned deadband by incorporating a predetermined offset into the sense current while the current is being sensed (during a "current sense mode") and subsequently removing the offset after the current is sensed (during an "autozero mode"), as explained in greater detail below.

In some examples, a current sense circuit is operable to sense current in a sense FET during a current sense mode. For example, during the current sense mode, a power FET and the sense FET are each selectively controlled to be operating so that the power FET and the sense FET are supplying respective drain currents to the current sense circuit. The sensed current in the sense FET includes a predefined offset that is inserted into the sensed current by an offset addition circuit during the current sense phase. The sensed current is amplified and converted to a digital value by an analog-to-digital (ADC) converter and stored. In order to remove the offset that is inserted during the current sense phase, the power FET and the sense FET are switched OFF (for example, gate-source voltages are 0 V) during an autozero phase while the offset addition circuit generates the offset voltage. This time, however, the offset is not added to the sense current; the offset alone is converted to a digital value. This digitized offset is subtracted from the stored digital value to generate a current sense value. This value represents the sensed current and can be generated for all values of the sensed current without the limitations of the aforementioned deadband.

Figure 2:
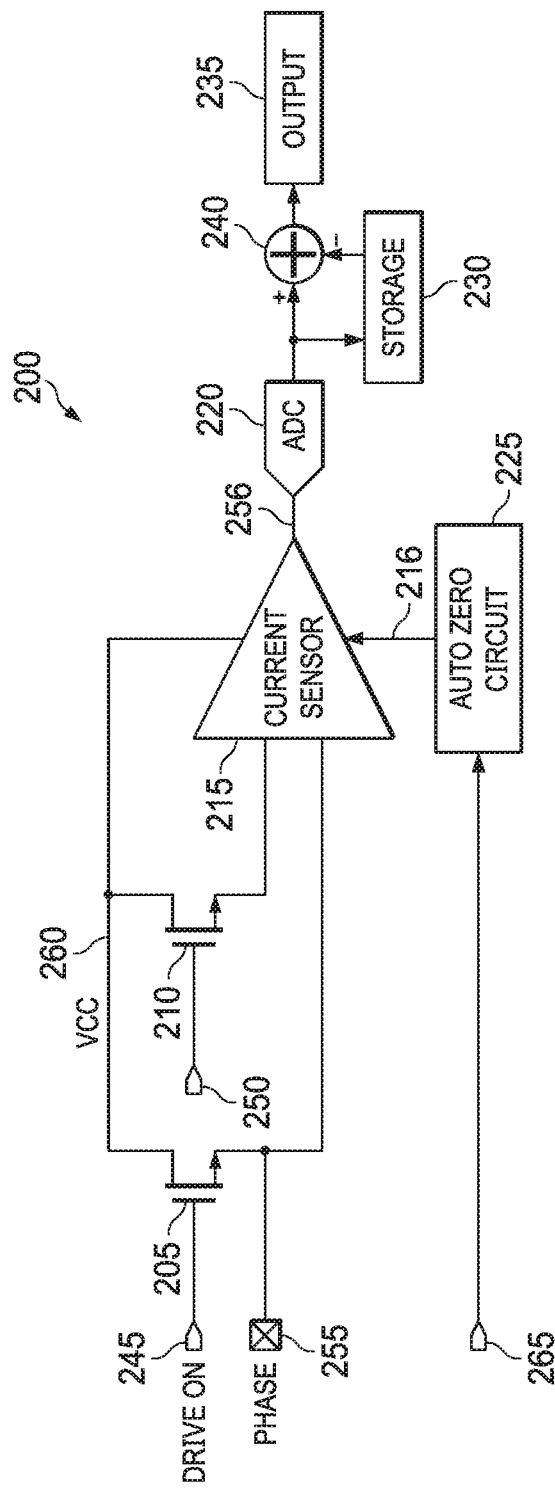
FIG. 2 is a conceptual diagram of a current sense circuit for a current sensing technique in accordance with various examples.

Referring now to FIG. 2, a conceptual diagram of a current sense circuit 200 for sensing current through a power FET 205 is depicted in accordance with various examples. In some examples, the current sense circuit 200 includes a power field effect transistor (FET) 205; a sense FET 210; a current sensor amplifier 215; an analog-to-digital converter (ADC) 220; an autozero circuit 225; storage 230 (e.g., non-volatile memory); an output current sense value 235; a subtraction block 240; a voltage node 245 coupled to the gate terminal of the power FET 205; a voltage node 250 coupled to the gate terminal of the sense FET 210; an output node 255 that couples to a motor phase (not expressly depicted); a voltage source VCC 260; and a voltage node 265 coupled to the autozero circuit 225. In some examples, VCC 260 couples to the drain terminals of the power FET 205 and the sense FET 210, as well as to the current sensor amplifier 215. The source terminal of the power FET 205 couples to the output node 255 and to an input of the current sensor amplifier 215. The source terminal of the sense FET 210 couples to another input of the current sensor amplifier 215. An output 256 of the current sensor amplifier 215 couples to an input of the ADC 220. An output of the ADC 220 couples to the subtraction block 240, as does an output of the storage 230. The output of the ADC 220 also couples to the storage 230. The output of the subtraction block 240 is the output current sense value 235. The autozero circuit 225 couples to the current sensor amplifier 215 via connection 216. In some examples, the power FET 205 is an N-channel class D power MOSFET, and the sense FET 210 is an n-type FET smaller in size (e.g., width-by-length size) than the power FET 205. The scope of disclosure is not limited to any particular type of transistor, however, and various other types of transistors are contemplated and fall within the scope of this disclosure. The same is true for the various FETs described below; in some examples, other types of transistors are substituted for the FETs. The example of FIG. 2 is merely illustrative of current sense circuits as contemplated herein. Various modifications are possible and fall within the scope of this disclosure.

Although the current sense circuit 200 is conceptual and generic in nature, its operation is now described to demonstrate the general operation of the myriad specific circuit implementations that can be achieved using the design principles of the current sense circuit 200. The current sense circuit 200 generally operates in two, non-simultaneous modes: a current sense mode and an autozero mode. During the current sense mode, the current sense circuit 200 drives a motor and senses the current used to drive the motor. The aforementioned offset is used to bias the sensed current so that it does not suffer from deadband, as explained above. The sensed current, which includes the offset, is digitized and stored. During the autozero mode, the current sense circuit 200 digitizes only the offset. The circuit 200 then subtracts the digitized offset from the digitized sensed current and produces a digitized output that represents the offset-free sensed current. These two modes are now described in greater detail.

The voltage nodes 245 and 250 receive the same signal: a DRIVE ON signal that comprises a pulse train. When a pulse is applied at the gate terminals of the power FET 205 and sense FET 210, the two FETs are turned ON and conduct current in channels formed between their respective source and drain terminals. In this situation, the circuit 200 is in the current sense mode. Conversely, when a pulse is absent from the gate terminals of the two FETs, these FETs are turned OFF and they do not conduct current between their respective source and drain terminals. In this situation, the circuit 200 is in the autozero mode. The switching action of the power FET 205 driven by the pulse train of the DRIVE ON signal causes bursts of current to be supplied to the output node 255, thus driving a phase of a motor coupled to the output node 255, such as a brushless direct current (DC) electric motor (not expressly depicted).

During the current sense mode, the voltages present at the source terminals of the power FET 205 and sense FET 210 are provided to gate terminals of transistors (e.g., FETs) in the current sensor amplifier 215. These transistors in the current sensor amplifier 215 have source terminals that couple to an amplifier, and one of these source terminals (e.g., the one belonging to the transistor coupled to the power FET 205) couples to one or more resistors (hereafter referred to as a single resistor) positioned between the source terminal and the amplifier. This resistor adds an offset voltage to the voltage at the source terminal of the transistor to which the resistor couples. The amplifier forces the source terminal voltage of the main FET 205 onto the source terminal of sense FET 210, which is equivalent to the offset voltage. This changes the drain-source voltage at the sense FET 210 and, by extension, the current flowing through the sense FET 210. In this way, an offset is applied to the sense current flowing through the sense FET 210. This sense current is subsequently converted to a low-voltage domain output 256 for use in circuitry having a relatively lower supply voltage as explained below, and the resulting voltage is converted from the analog to the digital domain by the ADC 220. The output of the ADC 220 is a digital signal—for example, an n-bit signal that is temporarily stored in any suitable storage, such as in the storage 230.

During the autozero mode, the aforementioned offset is isolated from the sensed current so that a digitized value representing this offset is stored in storage 230. In particular, the autozero circuit 225 is activated by applying a HIGH signal at voltage node 265, which was previously LOW during the current sense mode. Activating the autozero mode by driving the voltage node 265 HIGH causes the autozero circuit 225 to disconnect the source terminal of the power FET 205 from circuitry within the current sensor amplifier 215—for example, via connection 216. In lieu of the connection between the current sensor amplifier 215 and the source terminal of the power FET 205, the autozero circuit 225 establishes a connection between the circuitry of the current sensor amplifier 215 and VCC 260, thus facilitating the production of an offset even when the power FET 205 is OFF. Unlike the output of the current sensor amplifier 215 during the current sense mode, the output of the current sensor amplifier 215 during the autozero mode includes an offset component but does not include a current sense component. The offset component is provided to the ADC 220, which converts the analog signal into a digital signal (e.g., an n-bit signal). A difference is determined between the offset stored in storage 230 and the digitized current sense output during the current sense mode. The current sense value 235 represents this difference.

Figure 3:
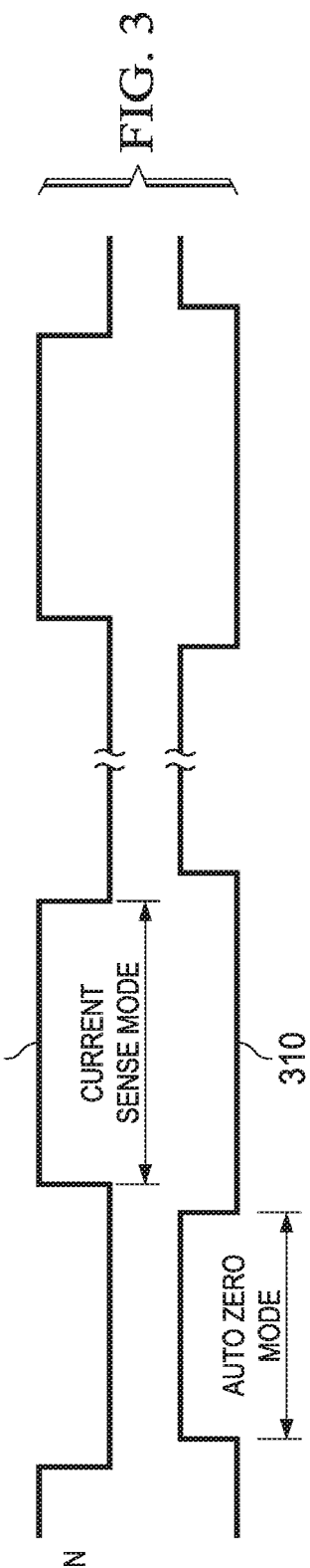
FIG. 3 illustrates a timing diagram for implementing a current sensing technique in accordance with various examples.

FIG. 3 depicts a timing diagram 300 of pulse train signals that are used to selectively control the power FET 205, the sense FET 210, and the autozero circuit 225 in order to implement the current sensing technique in accordance with various examples. In an example, signal 305 is a pulse train signal that is applied to voltage nodes 245 and 250 (e.g., the DRIVE ON signal described above with respect to FIG. 2), and signal 310 is a pulse train signal that is applied to autozero circuit 225 via voltage node 265. As shown in FIG. 3, the pulses of signal 305 do not overlap with the pulses of signal 310. As shown, the current sense mode is enabled when the signal 310 is LOW and the signal 305 is HIGH. In addition, as shown, the autozero mode is enabled when the signal 310 is HIGH and the signal 305 is LOW. As depicted, in some examples, a delay is present between each pulse of the signal 305 and the subsequent pulse of the signal 310, and, similarly, a delay is present between each pulse of the signal 310 and each subsequent pulse of the signal 305. The durations of such delays are variable as desired and as appropriate.

Figure 4:
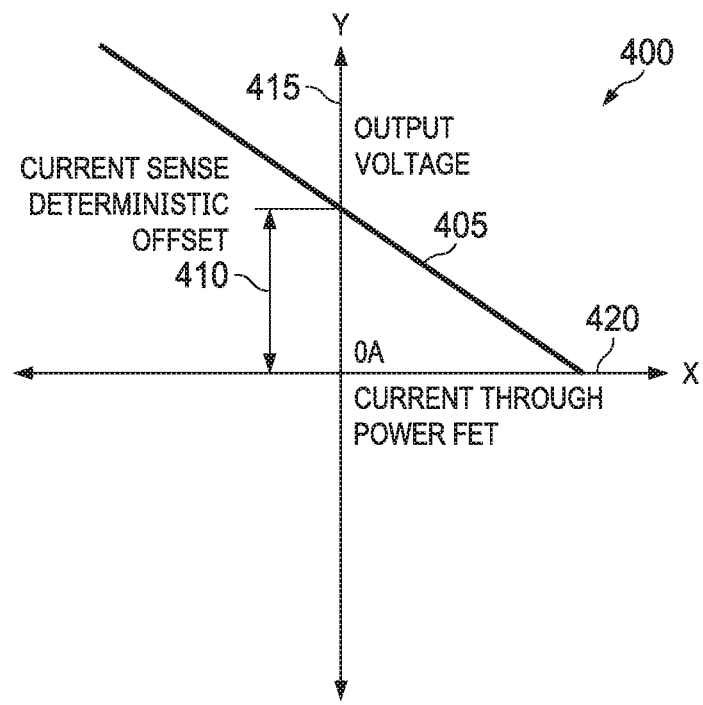
FIG. 4 illustrates a transfer function of input current and sensed output voltage according to a current sensing technique in accordance with various examples.

FIG. 4 depicts a graph 400 of a transfer function 405 for sensed current through a power FET (e.g., power FET 205) and sensed output voltage of a current sense amplifier (e.g., in the current sensor amplifier 215) in accordance with examples. As shown in FIG. 4, sensed current through a power FET is depicted along an X-axis 420 and the output voltage of a current sense amplifier is depicted along a Y-axis 415. The transfer function 405 represents a shifting of the transfer function curve 105 of FIG. 1 by a predetermined offset voltage 410 due to the offset introduced by the current sensor amplifier 215 as described above and as described in greater detail below with reference to FIG. 5. The offset shifts the transfer function curve 105 upward for negative and positive sensed currents so that a deadband (saturation) is not present as it is in FIG. 1. In an example, if a maximum current range for a sense FET is 3 A, the point where the transfer function curve 105 saturates is 3 A (see FIG. 1), which, in this example, is also the maximum current that is used to drive a phase of a motor.

Figure 5:
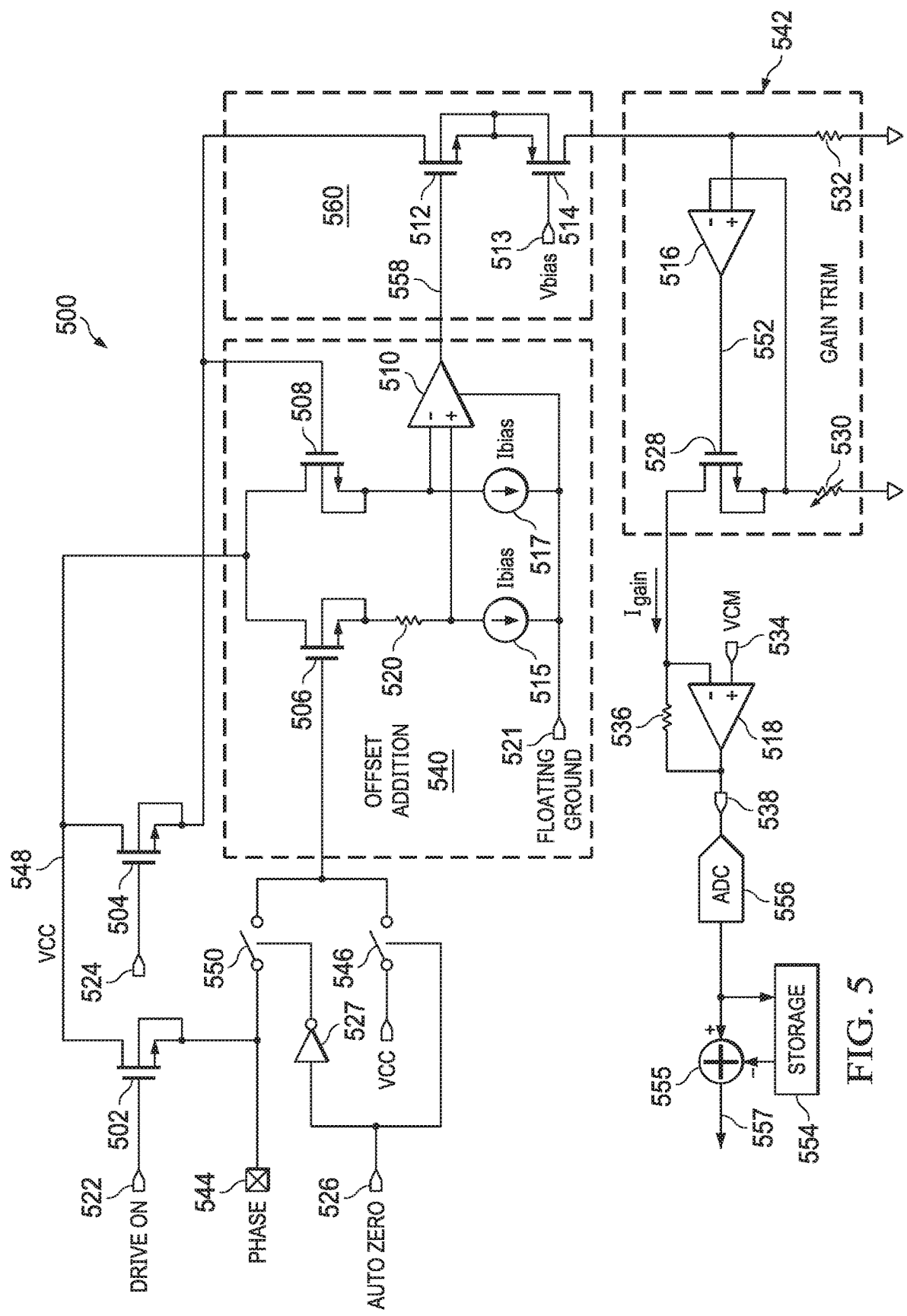
FIG. 5 is a schematic diagram of a current sense circuit for a current sensing technique in accordance with various examples.

Referring now to FIG. 5, a schematic diagram of a current sense circuit 500 for implementing a current sensing technique is depicted in accordance with examples. The current sense circuit 500 is an example implementation of the current sense circuit 200 of FIG. 2, although the scope of disclosure for the current sense circuit 200 is not limited to the current sense circuit 500. As noted above, the current sense circuit 200 is generic. Thus, the current sense circuit 500 contains circuitry and additional implementation details that are not depicted in FIG. 2.

Current sense circuit 500 is implemented, for example, as a standalone device (for example, implemented on its own substrate, enclosed within its own electrical chip package, etc.), implemented with other electrical devices in which current to a motor is to be measured, enclosed in an electrical chip package that includes other devices, etc. In examples, the current sense circuit 500 alternatingly operates in one of two operating modes, such as, for example, a current sense mode and an autozero mode. In an example, these operating modes are enabled in the current sense circuit 500 using pulse train signals to selectively control one or more circuits in the current sense circuit 500.

In examples, the current sense circuit 500 comprises a power FET 502 (e.g., an n-channel class D power MOSFET), a sense FET 504 (e.g., an n-type FET), an offset addition circuit 540, a cascode amplifier circuit 560, and a gain trim circuit 542. In some examples, the sense FET 504 has a width-by-length size that has a predetermined ratio relative to the width-by-length size of the larger power FET 502. The specific sizing ratio between the power FET 502 and the sense FET 504 is selected as desired and as appropriate. In addition, the current sense circuit 500 includes a voltage node 522 coupled to the gate terminal of the power FET 502, a voltage node 524 coupled to the gate terminal of the sense FET 504, and a voltage source VCC 548 coupled to the drain terminals of the power FET 502 and the sense FET 504. A voltage node 526 couples to a switch 550 (e.g., a transistor) via an inverter 527 and to a switch 546 (e.g., a transistor) that switchably couples the VCC 548 to the offset addition circuit 540. The source terminal of the FET 502 couples to the switch 550 and to an output node 544.

In examples, the offset addition circuit 540 comprises a FET 506 (e.g., an n-type FET), a FET 508 (e.g., an n-type FET), a resistor 520, a bias current source 515, a bias current source 517, and a differential amplifier 510. The FETs 506 and 508 are matched and are biased similarly such that similar $I_{DS}$ currents flow from the VCC 548 through each FET 506, 508. The drains of the FETs 506 and 508 couple to VCC 548. The gate terminal of the FET 506 couples to the switches 546 and 550. The gate terminal of the FET 508 couples to the source terminal of the sense FET 504. The resistor 520 couples to the source terminal of the FET 506, to the bias current source 515, and to a non-inverting input of the differential amplifier 510. The source terminal of the FET 508 couples to the bias current source 517 and to the inverting input of the differential amplifier 510. The bias current sources 515 and 517 and the differential amplifier 510 couple to a floating ground voltage node 521, which is electrically isolated from the ground connections described below.

The output 558 of the differential amplifier 510 couples to a gate terminal of a FET 512 (e.g., an n-type FET). In addition to the FET 512, the cascode amplifier circuit 560 comprises a FET 514 (e.g., p-type FET) having a source terminal that couples to the source terminal of the FET 512. A bias voltage node 513 couples to the gate terminal of the FET 514, and the bias voltage $V_{bias}$ applied to the bias voltage node 513 depends on the desired behavior of the FET 514 in order to protect the FET 512 from over-voltage conditions. Specifically, in examples, FET 512 is a low-voltage n-type FET, and in some examples, the FET 512 cannot tolerate gate-to-source voltages exceeding 5 V. In case the source voltage is greater than 5 V, the FET 512 should be protected from damage by the FET 514 (e.g., p-type FET), which, in examples, can tolerate a higher drain-to-source voltage and a higher drain-to-gate voltage.

In examples, the gain trim circuit 542 comprises a resistor 532 coupled to the drain terminal of the FET 514 and to a non-inverting input of a differential amplifier 516. The gain trim circuit 542 additionally includes a FET 528 (e.g., an n-type FET) having a gate terminal that couples to an output 552 of the differential amplifier 516. A source terminal of the FET 528 couples to an inverting input of the differential amplifier 516 and to a variable resistor 530. The variable resistor 530, in turn, couples to ground, as does the resistor 532.

A drain terminal of the FET 528 couples to an inverting input of a differential amplifier 518 and to a resistor 536, which, in turn, couples to an output of the differential amplifier 518. A common mode voltage node 534 couples to a non-inverting input of the differential amplifier 518. The common mode voltage applied to the common mode voltage node 534 is chosen to be close to 0 V so that the dynamic range of the differential amplifier 518 is most fully used. The output of the differential amplifier 518 couples to an output node 538. The output node 538, in turn, couples to an ADC 556, which, in turn, couples to a subtractor block 555 that receives input from storage 554. An output 557 of the subtractor block 555 is the output of the current sense circuit 500.

As mentioned above, the current sense circuit 500 of FIG. 5 is illustrative of the conceptual and more generic current sense circuit 200 of FIG. 2. In examples, the power FET 502 and sense FET 504 correspond to the power FET 205 and sense FET 210, respectively. The offset addition circuit 540, cascode amplifier circuit 560, gain trim circuit 542, differential amplifier 518, voltage node 534, resistor 536, and output node 538 generally correspond to the current sensor amplifier 215. In addition, the ADC 556 corresponds to the ADC 220, and the storage 554 and subtraction block 555 correspond to the storage 230 and subtraction block 240, respectively.

In operation, the pulse train DRIVE ON signal that was described above as being applied to voltage nodes 245 and 250 (FIG. 2) and that was illustrated by signal 305 (FIG. 3) is applied to the voltage nodes 522 and 524. The pulse train AUTOZERO signal that was described above as being applied to voltage node 265 (FIG. 2) and that was illustrated by signal 310 (FIG. 3) is applied to the voltage node 526. When the DRIVE ON signal is HIGH, the power FET 502 and the sense FET 504 turn ON. The power FET 502 conducts current that is used to power a phase of a motor (or any other suitable device) via the output node 544. As the timing diagram 300 in FIG. 3 indicates, when the DRIVE ON signal (e.g., signal 305) is HIGH, the AUTOZERO signal (e.g., signal 310) is LOW. Because the signal applied at the voltage node 526 is LOW, the inverter 527 applies a HIGH signal to control the switch 550, thus causing the switch 550 to close. At the same time, the switch 546 opens.

The voltage formed at the source terminal of the power FET 502 is applied to the gate terminal of the FET 506, turning on the FET 506. Similarly, the sense FET 504 is ON, and the voltage formed at the source terminal of the sense FET 504 is applied to the gate terminal of the FET 508, turning on the FET 508. The drain terminals of both of the FETs 506 and 508 couple to VCC 548, and when the FETs 506 and 508 are ON, these FETs conduct current. The currents flowing through the FETs 506 and 508 are biased using the bias current sources 515 and 517. The precise bias currents applied by the bias current sources 515 and 517 vary, but in some examples the currents are equivalent to a bandgap voltage of the current sense circuit 500 divided by the resistance of the resistor 520. Current flowing through the FET 506, as biased by the bias current source 515, flows through the resistor 520. The current flowing through the resistor 520 introduces an additional voltage potential, which is the aforementioned offset voltage, to the non-inverting input of the differential amplifier 510. In examples, the signals provided to the inputs of the differential amplifier 510 are identical or virtually identical except for the offset voltage introduced by the resistor 520.

The output 558 of the differential amplifier 510 is applied to the gate terminal of the FET 512. A voltage similar to the gate terminal voltage (minus, e.g., a threshold voltage) is present at the drain terminal of the FET 512. (In examples, the resistor 520 is designed to compensate for the voltage drop across the gate-drain terminals of the FET 512.) This voltage, which closely approximates the offset voltage, causes the voltage across the drain-source terminals of the sense FET 504 to be approximately equal to the voltage across the drain-source terminals of the power FET 502 plus the offset voltage. The resulting current through the sense FET 504 includes this combined voltage. Because the output signal 558 is sufficient to turn ON the FET 512 and because the bias voltage node 514 receives a bias voltage sufficient to turn on the FET 514, the current from the sense FET 504 flows through the cascoded FETs 512 and 514 toward the gain trim circuit 542. In examples, the differential amplifier 510 drives the FET 512 such that the voltage at the node between the FETs 512, 514 is equal to or closely approximates the voltage at the source of sense FET 504. The FET 514 acts as a bias FET to protect the FET 512 from stress or damage due to an excessively high gate-source voltage.

The current flowing into the gain trim circuit 542 flows through the resistor 532, generating a voltage at the non-inverting input of the differential amplifier 516. The inverting input of the differential amplifier 516 is a feedback input that receives the voltage present at the node between the variable resistor 530 and the FET 528 (the source terminal of the FET 528). The amplification provided by the differential amplifier 516 varies based at least in part on the trim setting of the variable resistor 530. For example, the variable gain of the differential amplifier 516 depends on a ratio of resistances of the variable resistor 530 and resistor 532. The output 552 of the differential amplifier 516 drives the gate terminal of the FET 528. Thus, the output 552 determines the degree to which the FET 528 turns ON, thus regulating the current flow $I_{gain}$ through the FET 528 and toward the differential amplifier 518 and resistor 536.

The gain of the differential amplifier 518 is determined at least in part by the resistor 536. The inverting input to the differential amplifier 518 is the signal present at the drain terminal of the FET 528, and the non-inverting input to the differential amplifier 518 is a common mode voltage applied at the voltage node 534. The common mode voltage defines the voltage at the output of the differential amplifier 518 when no current flows through the sense FET 504. The output of the differential amplifier 518 is provided at the output node 538. As explained above with respect to FIG. 2, such an output—which is an analog signal—is provided to the ADC 556 for conversion to a digital signal. The storage 554 stores the digital signal output by the ADC 556.

The foregoing description of the operation of the current sense circuit 500 is premised on the HIGH status of the DRIVE ON signal and the LOW status of the AUTOZERO signal. When the DRIVE ON signal switches to a LOW status and the AUTOZERO signal switches to HIGH status, the power FET 502 and sense FET 504 switch OFF. In addition, because the AUTOZERO signal is HIGH, the inverter 527 causes the switch 550 to open and the switch 546 to close. The switch 546, when closed, couples the gate terminal of the FET 506 to VCC 548. This causes the FET 506 to turn ON, thereby causing current to flow between the drain and source terminals of the FET 506. The voltage drop across the drain-to-source terminal $VDS_{506}$ of NMOS 506 and the voltage drop across offset resistor 520 causes a first voltage, for example, VCC–$V_{th}$–Ibias*Roffset 520, to be applied to the non-inverting terminal of differential amplifier 510, where $V_{th}$ is the threshold voltage of the NMOS 506, and where Ibias is the bias current provided by the bias current source 515. Similarly, a voltage drop across the drain-to-source terminal $VDS_{508}$ of NMOS 508 causes a second voltage, for example, VCC–$V_{th}$, to be applied to the inverting terminal of differential amplifier 510. The difference in the first and second voltages at the inputs of the differential amplifier 510 is the offset voltage (Ibias*Roffset 520) that affects the transfer function, as described above. Because the differential amplifier 510 compensates via its feedback loop through FET 508 for the differential inputs at the inverting and non-inverting terminals (for example, the differential amplifier 510 tries to make the inputs equal), the differential amplifier 510 provides the output 558 to correct for the offset voltage at the inputs.

After this signal is provided to the gain trim circuit 542 via the cascode amplifier circuit 560, it is processed as described above. The signal output at the output node 538 is digitized by the ADC 556, and the output of the ADC 556—which includes only the offset voltage—is subtracted from the digital value stored in the storage 554, which includes the offset voltage in addition to the voltage across the power FET 502 when the DRIVE ON signal was most recently HIGH, as described above. The subtraction block 555 performs this subtraction. The resulting output signal 557 is a digital value that indicates the current flowing through the sense FET 504. The current flowing through the sense FET 504 can be used in tandem with the sizing ratio between the power FET 502 and sense FET 504 to determine the current flowing through the power FET 502.

In the examples provided above, the signal combining the voltage across the power FET 502 and the offset voltage is stored in the storage 554 and the signal containing only the offset voltage is subsequently subtracted from the value stored in the storage 554. However, in some examples, this sequence is reversed such that the offset voltage is stored in the storage 554 and is subtracted from the subsequently-produced signal combining the voltage across the power FET 502 and the offset voltage.

In the foregoing discussion and in the claims, the terms "including" and "comprising" are used in an open-ended fashion, and thus should be interpreted to mean "including, but not limited to . . . ." Also, the term "couple," "couples" or "coupled" is intended to mean either an indirect or direct connection. Thus, if a first device couples to a second device, that connection may be through a direct connection or through an indirect connection via other devices and connections. Unless otherwise stated, "about," "approximately," or "substantially" preceding a value means +/–10 percent of a stated value.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. An apparatus for sensing current, comprising:
    a power transistor;
    a sense transistor coupled to the power transistor;
    an offset addition circuit coupled to the power transistor and the sense transistor, the offset addition circuit comprising a first pair of transistors and a differential amplifier;
    a cascode amplifier circuit coupled to the offset addition circuit, the cascode amplifier circuit comprising a second pair of transistors;
    a gain trim circuit coupled to the cascode amplifier circuit, the gain trim circuit including another differential amplifier and a third transistor;
    an analog-to-digital converter (ADC) coupled to the gain trim circuit; and
    storage coupled to the ADC.

2. The apparatus of claim 1, wherein the gain trim circuit further comprises:
    an input resistor coupled to the another differential amplifier; and
    a variable resistor coupled in a feedback loop to the another differential amplifier.

3. The apparatus of claim 2, wherein the another differential amplifier has a variable gain based on a ratio of resistances of the variable resistor and the input resistor.

4. The apparatus of claim 2, further comprising a third differential amplifier coupled to the gain trim circuit.

5. The apparatus of claim 1, further comprising a switch positioned between the power transistor and one of the first pair of transistors.

6. The apparatus of claim 5, further comprising a second switch positioned between the one of the first pair of transistors and a voltage source.

7. The apparatus of claim 6, wherein the switch and the second switch are controlled by inverse forms of a common signal.

8. The apparatus of claim 1, wherein terminals of the first pair of transistors couple to terminals of the power and sense transistors, wherein additional terminals of the first pair of transistors couple to the differential amplifier, and wherein the differential amplifier couples to one of the second pair of transistors.

9. An apparatus for sensing current, comprising:
    a power transistor;
    a sense transistor coupled to the power transistor; and an offset addition circuit coupled to the power and sense transistors and comprising:
a first transistor configured to couple to the power transistor via a switch;
a second transistor coupled to the sense transistor;
a resistor coupled to the first transistor; and
a differential amplifier having inputs coupled to the resistor and the second transistor and having an output coupled to a cascode amplifier circuit, the cascode amplifier circuit coupled to the sense transistor in a feedback loop configuration.

10. The apparatus of claim 9, further comprising a voltage node coupled to the switch via an inverter and coupled to another switch, the another switch configured to couple the first transistor to a voltage source.

11. The apparatus of claim 9, wherein the drain terminals of the power and sense transistors are coupled together, and wherein the gate terminals of the power and sense transistors are configured to receive a common signal.

12. The apparatus of claim 9, further comprising first and second bias current sources coupled to the resistor and the second transistor, respectively.

13. The apparatus of claim 9, wherein the cascode amplifier circuit includes a pair of transistors, wherein a first transistor in the pair of transistors is an n-type field effect transistor and a second transistor in the pair of transistors is a p-type field effect transistor.

14. The apparatus of claim 9, further comprising a gain trim circuit coupled to the cascode amplifier circuit, wherein the gain trim circuit comprises:
another differential amplifier having a first input coupled to the cascode amplifier circuit and to another resistor, a second input coupled to a variable resistor and to a source terminal of a third transistor, and an output coupled to a gate terminal of the third transistor.

15. The apparatus of claim 14, further comprising a third differential amplifier coupled to the third transistor and a common mode voltage node.

16. The apparatus of claim 15, further comprising an analog-to-digital converter (ADC) coupled to the third differential amplifier and further coupled to storage.

17. An apparatus for sensing current, comprising:
a power transistor;
a sense transistor coupled to the power transistor;
an offset addition circuit coupled to each of the power transistor and the sense transistor, wherein the offset addition circuit comprises:
a first transistor comprising a first drain terminal, a first source terminal, and a first gate terminal;
a second transistor comprising a second drain terminal, a second source terminal, and a second gate terminal, wherein the first drain terminal and the second drain terminal are each coupled to a voltage source;
a first amplifier comprising a first inverting terminal, a first non-inverting terminal, and a first output terminal; and
a resistor coupled to the first source terminal and to each of the first non-inverting terminal of the first amplifier and a bias current source;
a first switch coupled to the power transistor, to an inverter, and to the first gate terminal of the first transistor;
a second switch coupled to the voltage source, to the inverter, and to the first gate terminal of the first transistor;
a cascode amplifier circuit comprising a third transistor comprising a third drain terminal, a third source terminal, and a third gate terminal, the cascode amplifier circuit further comprising a fourth transistor including a fourth drain terminal, a fourth source terminal, and a fourth gate terminal, the third gate terminal coupled to the first output terminal of the first amplifier, the third drain terminal coupled to the sense transistor, the third source terminal coupled to the fourth source terminal;
a gain trim circuit coupled to the fourth drain terminal and comprising:
a second amplifier comprising a second inverting terminal, a second non-inverting terminal, and a second output terminal;
a second resistor coupled to the second non-inverting terminal;
a variable resistor coupled in a feedback loop to the second inverting terminal; and
a third transistor coupled to each of the second output terminal and to the trim resistor;
a third amplifier having a third inverting terminal, a third non-inverting terminal, and a third output terminal, the third inverting terminal coupled to the third transistor and to the third output terminal via a third resistor;
an analog-to-digital converter (ADC) coupled to the third output terminal;
storage coupled to the ADC; and
subtraction logic coupled to the storage and to the ADC.

18. The apparatus of claim 17, further comprising another current bias source coupled to the second source terminal of the second transistor.

19. The apparatus of claim 17, wherein the second gate terminal couples to the sense transistor.

20. The apparatus of claim 17, wherein the first inverting terminal and the first non-inverting terminal couple to a floating ground connection.

* * * * *